(12) United States Patent
Kohama et al.

(10) Patent No.: US 9,407,216 B2
(45) Date of Patent: Aug. 2, 2016

(54) ANALOG FEEDBACK AMPLIFIER

(71) Applicants: Tatsuo Kohama, Tokyo (JP); Yutaro Yamaguchi, Tokyo (JP); Naoko Nitta, Tokyo (JP); Kenji Mukai, Tokyo (JP); Hiroshi Otsuka, Tokyo (JP); Kenichi Horiguchi, Tokyo (JP); Morishige Hieda, Tokyo (JP); Koji Yamanaka, Tokyo (JP); Satoshi Miho, Tokyo (JP)

(72) Inventors: Tatsuo Kohama, Tokyo (JP); Yutaro Yamaguchi, Tokyo (JP); Naoko Nitta, Tokyo (JP); Kenji Mukai, Tokyo (JP); Hiroshi Otsuka, Tokyo (JP); Kenichi Horiguchi, Tokyo (JP); Morishige Hieda, Tokyo (JP); Koji Yamanaka, Tokyo (JP); Satoshi Miho, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 3 days.

(21) Appl. No.: 14/414,283

(22) PCT Filed: Sep. 21, 2012

(86) PCT No.: PCT/JP2012/074243
§ 371 (c)(1),
(2) Date: Jan. 12, 2015

(87) PCT Pub. No.: WO2014/045409
PCT Pub. Date: Mar. 27, 2014

(65) Prior Publication Data
US 2015/0207476 A1    Jul. 23, 2015

(51) Int. Cl.
| | |
|---|---|
| *H03G 3/20* | (2006.01) |
| *H03F 3/21* | (2006.01) |
| *H03F 1/34* | (2006.01) |
| *H03F 1/02* | (2006.01) |
| *H03G 3/30* | (2006.01) |
| *H03F 3/19* | (2006.01) |
| *H03F 3/189* | (2006.01) |
| *H03F 3/24* | (2006.01) |

(52) U.S. Cl.
CPC .. *H03F 3/21* (2013.01); *H03F 1/02* (2013.01); *H03F 1/34* (2013.01); *H03F 3/189* (2013.01); *H03F 3/19* (2013.01); *H03F 3/24* (2013.01); *H03G 3/3042* (2013.01); *H03F 2200/135* (2013.01); *H03F 2200/408* (2013.01); *H03F 2200/78* (2013.01)

(58) Field of Classification Search
CPC ........ H03F 1/3282; H03F 1/3288; H03G 3/20
USPC .................. 330/107, 136, 280, 285
See application file for complete search history.

(56) References Cited

U.S. PATENT DOCUMENTS

| | | | |
|---|---|---|---|
| 4,276,514 A | 6/1981 | Huang | |
| 6,275,685 B1 | 8/2001 | Wessel et al. | |
| 6,741,127 B2 * | 5/2004 | Sasho | H03F 1/0227 330/136 |
| 2007/0184792 A1 | 8/2007 | Drogi et al. | |
| 2014/0300420 A1 | 10/2014 | Kohama et al. | |

FOREIGN PATENT DOCUMENTS

| | | |
|---|---|---|
| JP | S52-037750 A | 3/1977 |
| JP | S62-078902 A | 4/1987 |
| JP | 2000-216640 A | 8/2000 |

OTHER PUBLICATIONS

International Search Report; PCT/JP2012/074243; Dec. 18, 2012.
Kenington, Peter B.; "High-Linearity RF Amplifier Design"; Artech House, Inc., 2000; pp. 161-166.

* cited by examiner

*Primary Examiner* — Steven J Mottola
(74) *Attorney, Agent, or Firm* — Studebaker & Brackett PC

(57) ABSTRACT

A comparator 13 that detects the difference between a high frequency signal detected by a detector 12 and a feedback signal A output from a comparator 11; a comparator 14 that detects the difference between the difference detected by the comparator 13 and a feedback signal B output from an adder 18; and a loop filter 15 that passes only a prescribed low frequency band of the output signal of the comparator 14 are provided, in which an amplitude sensitivity adjuster 16 adjusts the amplitude sensitivity of a variable gain amplifier 3 in accordance with the rate of change of the signal passing through the loop filter 15, thereby controlling the gain of the variable gain amplifier 3.

9 Claims, 4 Drawing Sheets

ANALOG FEEDBACK AMPLIFIER

TECHNICAL FIELD

The present invention relates to an analog feedback amplifier with its band broadened by reducing the influence of group delay elements within a power amplifier.

BACKGROUND ART

For example, an analog feedback amplifier disclosed in a Patent Document 1 comprises a variable phase shifter that adjusts the phase of a baseband input signal, a variable gain amplifier that amplifies the input signal, and power amplifier that amplifies the input signal, and further comprises a control system that controls the phase shift of the variable phase shifter and the gain of the variable gain amplifier.

The control system comprises the following components.

(1) An attenuator that attenuates the signal amplified by the power amplifier, and outputs the signal after the attenuation as a feedback signal.

(2) A detector that detects the input signal.

(3) An amplitude comparator that detects the difference between the amplitude of the input signal detected by the detector and the feedback signal output from the attenuator.

(4) A phase comparator that detects the phase difference between the input signal and the feedback signal output from the attenuator.

(5) Again controller that controls the gain of the variable gain amplifier in accordance with the difference detected by the amplitude comparator.

(6) A loop filter that controls the phase shift of the variable phase shifter in accordance with the phase difference detected by the phase comparator.

PRIOR ART DOCUMENT

Patent Document

Patent Document 1: USP Pub. No.: US 2007/0184792 A1.

DISCLOSURE OF THE INVENTION

Problems to be Solved by the Invention

With the foregoing configuration, the conventional analog feedback amplifier includes group delay elements within the power amplifier in the feedback loop from the power amplifier to the variable gain amplifier and to the variable phase shifter via the amplitude comparator and phase comparator. Accordingly, it has a problem of making it difficult to broaden the band because the phase of the feedback signal fluctuates due to the influence of the group delay elements.

The present invention is implemented to solve the foregoing problem. Therefore it is an object of the present invention to provide an analog feedback amplifier capable of broadening the band by suppressing undesired fluctuations of the phase of the feedback signal even when the power amplifier includes the group delay elements.

Means for Solving the Problem

An analog feedback amplifier in accordance with the present invention comprises a first amplitude adjusting circuit that adjusts the amplitude of a signal after the amplification by a power amplifier; a second amplitude adjusting circuit that adjusts the amplitude of a signal after the amplification by a variable gain amplifier; a first delay circuit that delays the signal after the amplitude adjustment by the second amplitude adjusting circuit; a first signal difference detecting circuit that detects difference between the signal after the amplitude adjustment by the first amplitude adjusting circuit and the signal delayed through the first delay circuit, and outputs the difference as a first feedback signal; a second signal difference detecting circuit that detects the difference between the input signal and the first feedback signal output from the first signal difference detecting circuit; a gain control circuit that detects difference between the difference detected by the second signal difference detecting circuit and a second feedback signal, and controls gain of the variable gain amplifier in accordance with the difference; and a third amplitude adjusting circuit that adjusts amplitude of the difference detected by the gain control circuit, adds the difference after the amplitude adjustment to the input signal, and supplies the addition result to the gain control circuit as the second feedback signal.

Advantages of the Invention

According to the present invention, it is configured in such a manner as to comprise the first amplitude adjusting circuit that adjusts the amplitude of the signal after the amplification by the power amplifier; the second amplitude adjusting circuit that adjusts the amplitude of the signal after the amplification by the variable gain amplifier; the first delay circuit that delays the signal after the amplitude adjustment by the second amplitude adjusting circuit; the first signal difference detecting circuit that detects the difference between the signal after the amplitude adjustment by the first amplitude adjusting circuit and the signal delayed through the first delay circuit, and outputs the difference as a first feedback signal; and the second signal difference detecting circuit that detects the difference between the input signal and the first feedback signal output from the first signal difference detecting circuit, wherein the gain control circuit detects the difference between the difference detected by the second signal difference detecting circuit and the second feedback signal, and controls the gain of the variable gain amplifier in accordance with the difference. Accordingly, it offers an advantage of being able to broaden its band by suppressing the undesired fluctuations of the phase of the feedback signal even when the power amplifier includes the group delay elements.

BEST MODE FOR CARRYING OUT THE INVENTION

The best mode for carrying out the invention will now be described with reference to the accompanying drawings.

Embodiment 1

Figure 1:
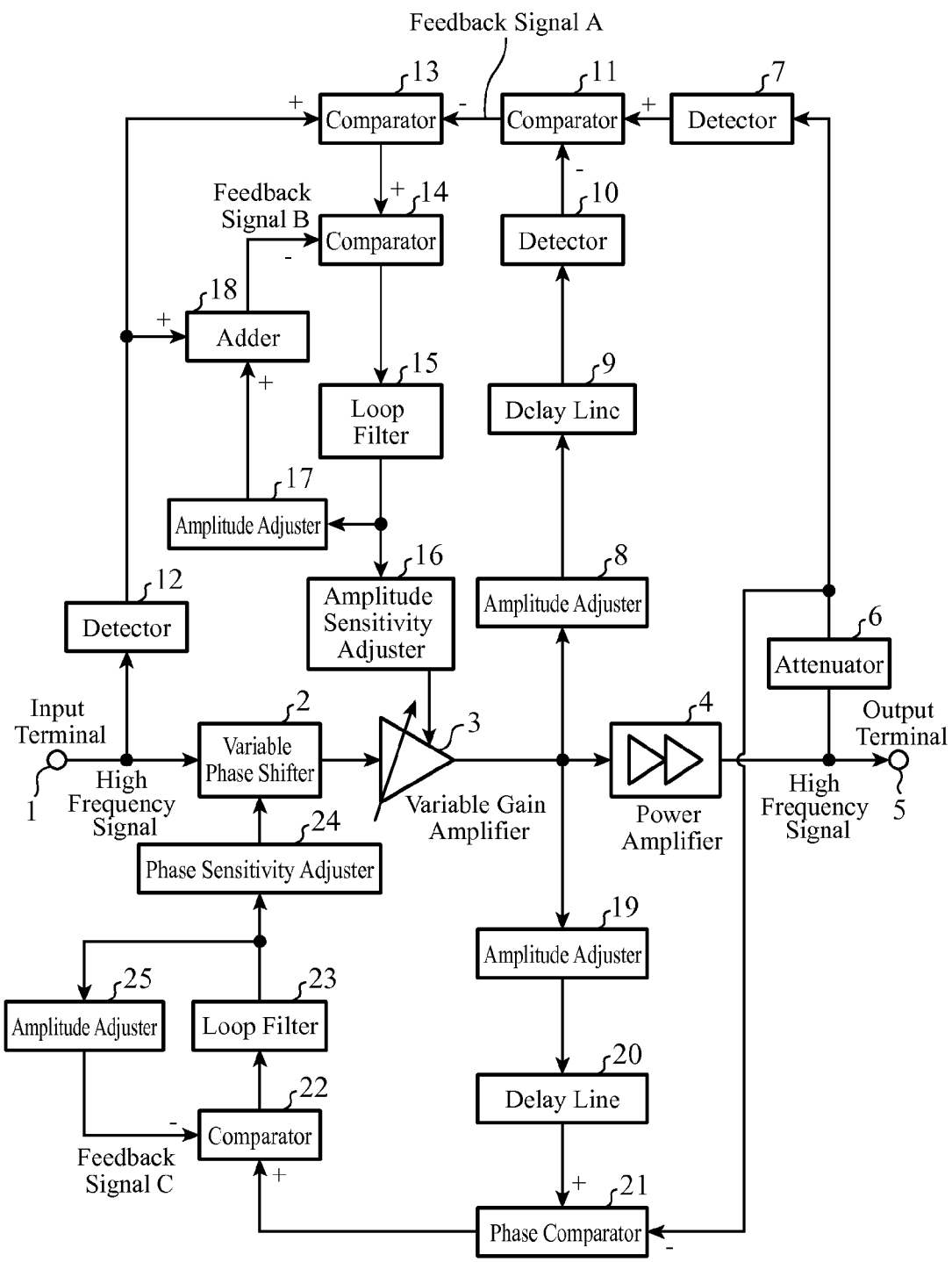
FIG. 1 is a block diagram showing a configuration of an analog feedback amplifier of an embodiment 1 in accordance with the present invention.

FIG. 1 is a block diagram showing a configuration of an analog feedback amplifier of an embodiment 1 in accordance with the present invention.

In FIG. 1, an input terminal 1 is a terminal for inputting a high frequency signal (input signal).

A variable phase shifter 2 is a signal processor that adjusts the phase of the high frequency signal input via the input terminal 1.

A variable gain amplifier 3 is a signal processor that amplifies the high frequency signal whose phase is adjusted by the variable phase shifter 2.

A power amplifier 4 is a signal processor that amplifies the high frequency signal after the amplification by the variable gain amplifier 3.

An output terminal 5 is a terminal that outputs the high frequency signal after the amplification by the power amplifier 4.

An attenuator 6 is a signal processor that attenuates the high frequency signal after the amplification by the power amplifier 4. Incidentally, the attenuator 6 constitutes a first amplitude adjusting unit.

A detector 7 is a signal processor that detects the high frequency signal attenuated by the attenuator 6.

An amplitude adjuster 8 is a signal processor that adjusts the amplitude of the high frequency signal after the amplification by the variable gain amplifier 3. Incidentally, the amplitude adjuster 8 constitutes a second amplitude adjusting unit.

A delay line 9 is a signal processor that delays the high frequency signal whose amplitude is adjusted by the amplitude adjuster 8. Incidentally, the delay line 9 constitutes a first delay unit.

A detector 10 is a signal processor that detects the high frequency signal delayed through the delay line 9.

A comparator 11 is a signal processor that detects the difference between the high frequency signal detected by the detector 7 (the high frequency signal attenuated by the attenuator 6) and the high frequency signal detected by the detector 10 (the high frequency signal delayed through the delay line 9), and supplies the difference to a comparator 13 as a feedback signal A (first feedback signal).

Incidentally, the detectors 7 and 10 and the comparator 11 constitute a first signal difference detecting unit.

A detector 12 is a signal processor that detects the high frequency signal input via the input terminal 1.

The comparator 13 is a signal processor that detects the difference between the high frequency signal detected by the detector 12 and the feedback signal A output from the comparator 11.

Incidentally, the detector 12 and comparator 13 constitute a second signal difference detecting unit.

A comparator 14 is a signal processor that detects the difference between the difference detected by the comparator 13 and a feedback signal B (second feedback signal) output from an adder 18.

A loop filter 15 is a signal processor that passes only a prescribed low frequency band of the output signal of the comparator 14 (signal denoting the difference between the difference detected by the comparator 13 and the feedback signal B).

An amplitude sensitivity adjuster 16 is a signal processor that controls the gain of the variable gain amplifier 3 by adjusting the amplitude sensitivity of the variable gain amplifier 3 in accordance with the rate of change of the signal passing through the loop filter 15 (signal within the prescribed low frequency band).

In the example of FIG. 1, although the amplitude sensitivity adjuster 16 is disposed between the loop filter 15 and the variable gain amplifier 3, the amplitude sensitivity adjuster 16 is not necessarily required, but the signal passing through the loop filter 15 can be supplied directly to the variable gain amplifier 3.

Incidentally, the comparator 14, loop filter 15 and amplitude sensitivity adjuster 16 constitute a gain control unit.

An amplitude adjuster 17 is a signal processor that adjusts the amplitude of the signal passing through the loop filter 15. The adder 18 is a signal processor that adds the high frequency signal detected by the detector 12 to the signal that passes through the loop filter 15 and has its amplitude adjusted by the amplitude adjuster 17, and supplies the addition result to the comparator 14 as the feedback signal B.

Incidentally, the amplitude adjuster 17 and adder 18 constitute a third amplitude adjusting unit.

An amplitude adjuster 19 is a signal processor that adjusts the amplitude of the high frequency signal after the amplification by the variable gain amplifier 3. Incidentally, the amplitude adjuster 19 constitutes a fourth amplitude adjusting unit.

A delay line 20 is a signal processor that delays the high frequency signal whose amplitude is adjusted by the amplitude adjuster 19. Incidentally, the delay line 20 constitutes a second delay unit.

A phase comparator 21 is a signal processor that detects the phase difference between the high frequency signal attenuated by the attenuator 6 and the high frequency signal delayed through the delay line 20, and supplies a signal with the amplitude corresponding to the phase difference to the comparator 22. Incidentally, the phase comparator 21 constitutes a phase difference detecting unit.

A comparator 22 is a signal processor that detects the difference between the output signal of the phase comparator 21 and a feedback signal C (third feedback signal) output from an amplitude adjuster 25.

A loop filter 23 is a signal processor that passes only a prescribed low frequency band of the output signal of the comparator 22 (signal designating the difference between the output signal of the phase comparator 21 and the feedback signal C).

A phase sensitivity adjuster 24 is a signal processor that controls the phase shift through the variable phase shifter 2 by adjusting the phase shift sensitivity of the variable phase shifter 2 in accordance with the rate of change of the signal passing through the loop filter 23 (signal within the prescribed low frequency band).

In the example of FIG. 1, although the phase sensitivity adjuster 24 is disposed between the loop filter 23 and the variable phase shifter 2, the phase sensitivity adjuster 24 is not necessarily required, but the signal passing through the loop filter 23 can be directly supplied to the variable phase shifter 2.

Incidentally, the comparator 22, loop filter 23 and phase sensitivity adjuster 24 constitute a phase shift control unit.

The amplitude adjuster 25 is a signal processor that adjusts the amplitude of the signal passing through the loop filter 23, and supplies the passing signal after the amplitude adjustment to the comparator 22 as the feedback signal C. Incidentally, the amplitude adjuster 25 constitutes a fifth amplitude adjusting unit.

Next, the operation will be described.

The high frequency signal input via the input terminal 1 is supplied to the variable phase shifter 2 and to the detector 12.

The variable phase shifter 2 undergoes the phase shift control by the phase sensitivity adjuster 24 which will be described later, adjusts the phase of the high frequency signal input via the input terminal 1 by the amount of the phase shift, and supplies the high frequency signal after the phase adjustment to the variable gain amplifier 3.

The variable gain amplifier 3 has its gain controlled by the amplitude sensitivity adjuster 16 which will be described later, and amplifies the high frequency signal supplied from the variable phase shifter 2.

The power amplifier 4 amplifies the high frequency signal after the amplification by the variable gain amplifier 3, and supplies the high frequency signal after the amplification to the output terminal 5 and attenuator 6.

Next, the gain control of the variable gain amplifier 3 will be described.

As for the analog feedback amplifier of FIG. 1, the power amplifier 4, attenuator 6, detector 7, comparators 11, 13 and 14, loop filter 15 and amplitude sensitivity adjuster 16 form a first feedback loop, and the first feedback loop carries out band setting and follow-up control of the variable gain amplifier 3.

In addition, the amplitude adjuster 8, delay line 9 and detector 10 form a second feedback loop inside the first feedback loop.

Furthermore, the amplitude adjuster 17 and adder 18 form a third feedback loop inside the second feedback loop.

The attenuator 6, receiving the high frequency signal after the amplification by the power amplifier 4, adjusts the amplitude of the high frequency signal by attenuating the high frequency signal, and supplies the high frequency signal after the amplitude adjustment to the detector 7.

The detector 7, receiving the high frequency signal after the amplitude adjustment from the attenuator 6, detects the high frequency signal.

On the other hand, the amplitude adjuster 8, receiving the high frequency signal after the amplification by the variable gain amplifier 3, adjusts the amplitude of the high frequency signal, and supplies the high frequency signal after the amplitude adjustment to the delay line 9.

The delay line 9, receiving the high frequency signal after the amplitude adjustment from the amplitude adjuster 8, delays the high frequency signal.

The detector 10 detects the high frequency signal delayed through the delay line 9.

The comparator 11 detects the difference between the high frequency signal detected by the detector 7 (the high frequency signal attenuated by the attenuator 6) and the high frequency signal detected by the detector 10 (the high frequency signal delayed through the delay line 9), and supplies the difference to the comparator 13 as the feedback signal A.

Here, the amplitude adjuster 8, delay line 9 and detector 10 form the second feedback loop as described above, in which the amount of the amplitude adjustment by the amplitude adjuster 8 is set considering the amplification level of the power amplifier 4 and the attenuation level of the high frequency signal through the attenuator 6, which are known. In addition, the amount of delay of the signal through the delay line 9 is set considering the signal processing time of the power amplifier 4, attenuator 6 and detectors 7 and 10.

More specifically, the amplitude adjustment by the amplitude adjuster 8 and the signal delay through the delay line 9 are set in such a manner as to zero the feedback signal A output from the comparator 11 considering the amplification level and attenuation level and the signal processing time, which are known.

Zeroing the feedback signal A output from the comparator 11 enables canceling the group delay elements of the power amplifier 4 existing on the first feedback loop, and the group delay elements of the power amplifier 4 appear outside the first feedback loop.

This means that the group delay elements of the power amplifier 4 can be handled equivalently to that they exist outside the first feedback loop.

Accordingly, even when the power amplifier 4 includes the group delay elements, the undesired fluctuations of the phase of the feedback signal fed to the variable gain amplifier 3 can be suppressed.

The detector 12 detects the high frequency signal input via the input terminal 1.

The comparator 13 detects the difference between the high frequency signal detected by the detector 12 and the feedback signal A output from the comparator 11.

When the comparator 13 detects the difference between the high frequency signal detected by the detector 12 and the feedback signal A, the comparator 14 detects the difference between the difference and the feedback signal B output from the adder 18.

The loop filter 15 stops the high frequency band of the output signal of the comparator 14 (signal designating the difference between the difference detected by the comparator 13 and the feedback signal B), and supplies only the prescribed low frequency band to the amplitude sensitivity adjuster 16 and amplitude adjuster 17.

Receiving the signal passing through the loop filter 15, the amplitude sensitivity adjuster 16 controls the gain of the variable gain amplifier 3 by adjusting the amplitude sensitivity of the variable gain amplifier 3 in accordance with the rate of change of the passing signal.

For example, it controls the amplitude sensitivity of the variable gain amplifier 3 in such a manner that if the signal passing through the loop filter 15 is multiplied by $\alpha$, the gain of the variable gain amplifier 3 is multiplied by $\beta$ ($\beta=\alpha*\gamma$, where $\gamma$ is a constant).

The amplitude adjuster 17, receiving the signal passing through the loop filter 15, adjusts the amplitude of the passing signal, and supplies the passing signal after the amplitude adjustment to the adder 18.

The adder 18 adds the high frequency signal detected by the detector 12 and the signal which passes through the loop filter 15 and has its amplitude adjusted by amplitude adjuster 17, and supplies the addition result to the comparator 14 as the feedback signal B.

Here, the amplitude adjuster 17 and adder 18 form the third feedback loop inside the second feedback loop as described above, and the third feedback loop feeds back the signal without the group delay elements instead of the signal that is originally fed back through the first feedback loop.

The phase control of the variable phase shifter 2 will now be described.

In the analog feedback amplifier of FIG. 1, the variable gain amplifier 3, power amplifier 4, attenuator 6, phase comparator 21, comparator 22, loop filter 23 and phase sensitivity adjuster 24 form the fourth feedback loop, and the fourth feedback loop carries out the band setting and the follow-up control of the variable phase shifter 2.

In addition, the amplitude adjuster 19 and delay line 20 form the fifth feedback loop inside the fourth feedback loop.

Furthermore, the amplitude adjuster 25 forms the sixth feedback loop inside the fifth feedback loop.

Receiving the high frequency signal after the amplification by the variable gain amplifier 3, the amplitude adjuster 19 adjusts the amplitude of the high frequency signal, and supplies the high frequency signal after the amplitude adjustment to the delay line 20.

Receiving the high frequency signal after the amplitude adjustment from the amplitude adjuster 19, the delay line 20 delays the high frequency signal.

The phase comparator 21 detects the phase difference between the high frequency signal attenuated by the attenuator 6 and the high frequency signal delayed through the delay line 20, and supplies the signal with the amplitude corresponding to the phase difference to the comparator 22. As the signal with the amplitude corresponding to the phase difference, for example, a signal with amplitude proportional to the phase difference is conceivable.

Here, the amplitude adjuster 19 and delay line 20 constitute the fifth feedback loop as described above, and the amount of the amplitude adjustment by the amplitude adjuster 19 is set considering the amplification level of the power amplifier 4 and the like which are known. In addition, the amount of delay of the signal passing through the delay line 20 is set considering the signal processing time of the power amplifier 4 and the like.

More specifically, the amplitude adjustment by the amplitude adjuster 19 and the signal delay through the delay line 20 are set in such a manner as to zero the phase difference detected by the phase comparator 21 considering the amplification level and the signal processing time which are known.

Zeroing the phase difference detected by the phase comparator 21 enables canceling the group delay elements of the power amplifier 4 existing on the fourth feedback loop, and the group delay elements of the power amplifier 4 appear outside the fourth feedback loop.

This means that the group delay elements of the power amplifier 4 can be handled equivalently to that they exist outside the fourth feedback loop.

Accordingly, even when the power amplifier 4 includes the group delay elements, the undesired fluctuations of the phase of the feedback signal fed to the variable phase shifter 2 can be suppressed.

The comparator 22 detects the difference between the output signal of the phase comparator 21 (the signal with the amplitude corresponding to the phase difference) and the feedback signal C output from the amplitude adjuster 25.

The loop filter 23 stops the high frequency band of the output signal of the comparator 22 (signal designating the difference between the output signal of the phase comparator 21 and the feedback signal C) so as to supply only the prescribed low frequency band to the phase sensitivity adjuster 24 and amplitude adjuster 25.

Receiving the signal passing through the loop filter 23, the phase sensitivity adjuster 24 adjusts the phase shift sensitivity of the variable phase shifter 2 in accordance with the rate of change of the passing signal, thereby controlling the phase shift by the variable phase shifter 2.

For example, it adjusts the phase shift sensitivity of the variable phase shifter 2 in such a manner that when the passing signal through the loop filter 24 is multiplied by a, the phase shift of the variable phase shifter 2 is multiplied by b (b=a*c, where c is a constant).

Receiving the signal passing through the loop filter 23, the amplitude adjuster 25 adjusts the amplitude of the passing signal, and supplies the passing signal after the amplitude adjustment to the comparator 22.

Here, the amplitude adjuster 25 forms the sixth feedback loop inside the fifth feedback loop as described above, and the sixth feedback loop feeds back the signal without the group delay elements instead of the signal that is originally fed back through the fourth feedback loop.

As is clear from the foregoing description, according to the present embodiment 1, it is configured in such a manner that it comprises the attenuator 6 that attenuates the high frequency signal after the amplification by the power amplifier 4; the amplitude adjuster 8 that adjusts the amplitude of the high frequency signal after the amplification by the variable gain amplifier 3; the delay line 9 that delays the high frequency signal after the amplitude adjustment by the amplitude adjuster 8; the comparator 11 that detects the difference between the high frequency signal attenuated by the attenuator 6 and the high frequency signal delayed through the delay line 9, and outputs the difference as the feedback signal A; the comparator 13 that detects the difference between the high frequency signal detected by the detector 12 and the feedback signal A output from the comparator 11; the comparator 14 that detects the difference between the difference detected by the comparator 13 and the feedback signal B output from the adder 18; and the loop filter 15 that passes only the prescribed low frequency band in the output signal of the comparator 14, wherein the amplitude sensitivity adjuster 16 adjusts the amplitude sensitivity of the variable gain amplifier 3 in accordance with the rate of change of the signal passing through the loop filter 15, thereby controlling the gain of the variable gain amplifier 3. Accordingly, even when the power amplifier 4 includes the group delay elements, the present embodiment 1 can suppress the undesired fluctuations of the phase of the feedback signal fed to the variable gain amplifier 3, thereby offering an advantage of being able to broaden the band.

In addition, according to the present embodiment 1, it is configured in such a manner that it comprises the attenuator 6 that attenuates the high frequency signal after the amplification by the power amplifier 4; the amplitude adjuster 19 that adjusts the amplitude of the high frequency signal after the amplification by the variable gain amplifier 3; the delay line 20 that delays the high frequency signal after the amplitude adjustment by the amplitude adjuster 19; the phase comparator 21 that detects the phase difference between the high frequency signal attenuated by the attenuator 6 and the high frequency signal delayed through the delay line 20, and outputs the signal with the amplitude corresponding to the phase difference; the comparator 22 that detects the difference between the output signal of the phase comparator 21 and the feedback signal C output from the amplitude adjuster 25; and the loop filter 23 that passes only the prescribed low frequency band of the output signal of the comparator 22, wherein the phase sensitivity adjuster 24 adjusts the phase shift sensitivity of the variable phase shifter 2 in accordance with the rate of change of the signal passing through the loop filter 23, thereby controlling the phase shift by the variable phase shifter 2. Accordingly, even when the power amplifier 4 includes the group delay elements, the present embodiment 1 can suppress the undesired fluctuations of the phase of the feedback signal fed to the variable phase shifter 2, thereby offering an advantage of being able to broaden the band.

Figure 2:
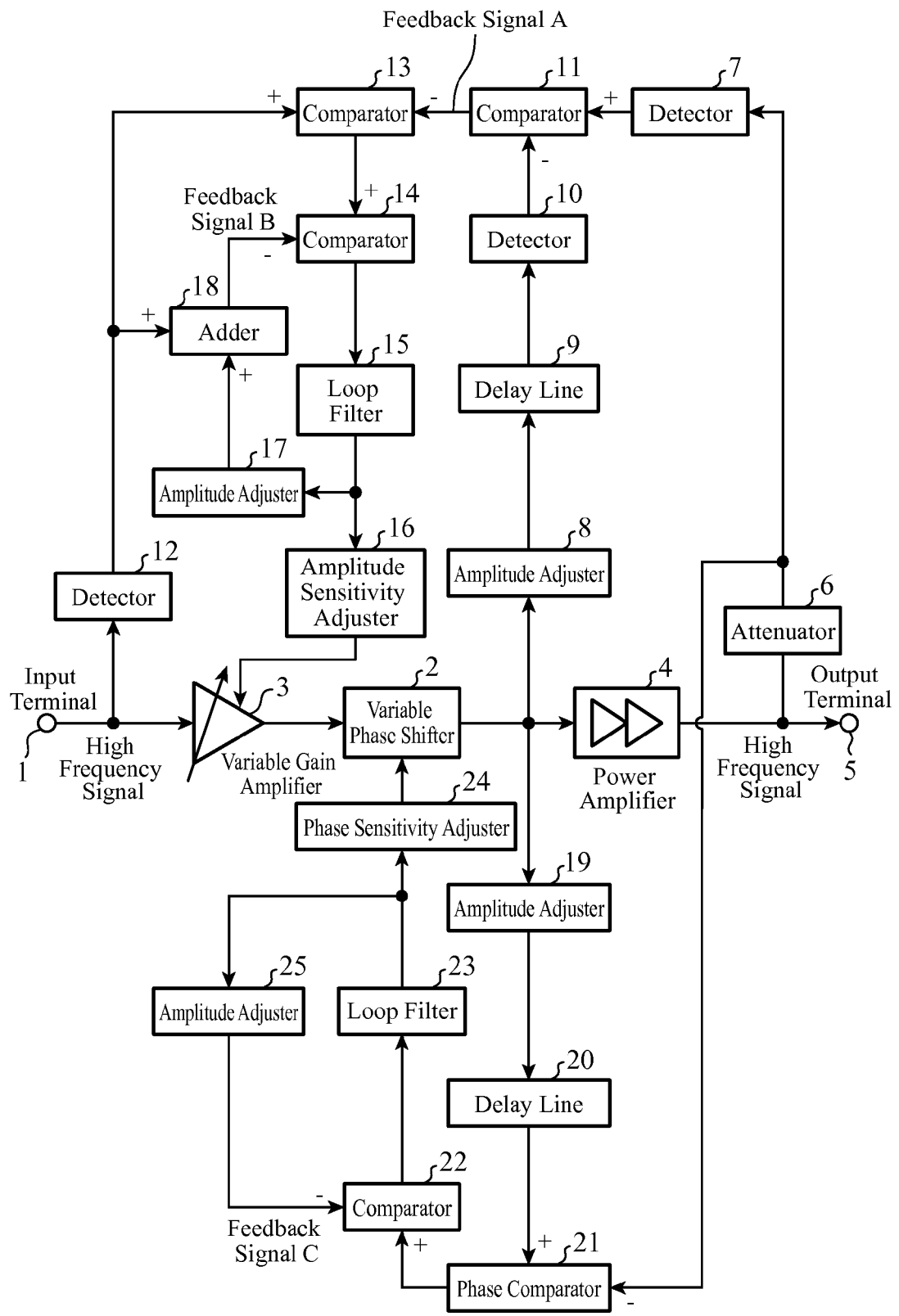
FIG. 2 is a block diagram showing another configuration of the analog feedback amplifier of the embodiment 1 in accordance with the present invention.

Although FIG. 1 shows an example of the configuration of the analog feedback amplifier which has the variable phase shifter 2, variable gain amplifier 3 and power amplifier 4 connected in series in this order, an analog feedback amplifier is also possible which has the variable gain amplifier 3, variable phase shifter 2 and power amplifier 4 connected in series in this order as shown in FIG. 2, which can achieve the same advantage (the advantage of being able to broaden the band by suppressing the undesired fluctuations of the phase of the feedback signal).

Although the present embodiment 1 shows an example in which the phase comparator 21 detects the phase difference between the high frequency signal attenuated by the attenuator 6 and the high frequency signal delayed through the delay line 20, and outputs the signal with the amplitude corresponding to the phase difference, any other components can be used instead of the phase comparator as long as they can output a signal with the amplitude corresponding to the phase difference.

In addition, although the present embodiment 1 shows an example in which the amplitude adjusters 8, 17, 19, and 25 adjust the amplitude of the signals, when the amount of the adjustment of the amplitude is unity (that is, when the amplitude of the input signal is equal to that of the output signal), the amplitude adjusters 8, 17, 19, and 25 can be removed.

In addition, although the present embodiment 1 shows an example in which the attenuator 6 attenuates the high frequency signal after the amplification by the power amplifier 4, when the amount of the attenuation of the amplitude is unity (that is, when the amplitude of the input signal is equal to that of the output signal), the attenuator 6 can be omitted.

Although the present embodiment 1 shows an example in which the delay lines 9 and 20 delay the high frequency signals after the amplitude adjustment by the amplitude adjusters 8 and 19, any other components capable of delaying the high frequency signal after the amplitude adjustment can also be used such as a lumped circuit comprised of an inductor and capacitor, and a delay circuit comprised of a semiconductor.

In addition, although the present embodiment 1 has the amplitude adjuster 8, the delay line 9, and the detector 10 connected in series in this order, the order can be changed as long as they are connected in series.

In addition, although the present embodiment 1 has the amplitude adjuster 19 and the delay line 20 connected in series in this order, the order can be changed as long as they are connected in series.

Embodiment 2

Figure 3:
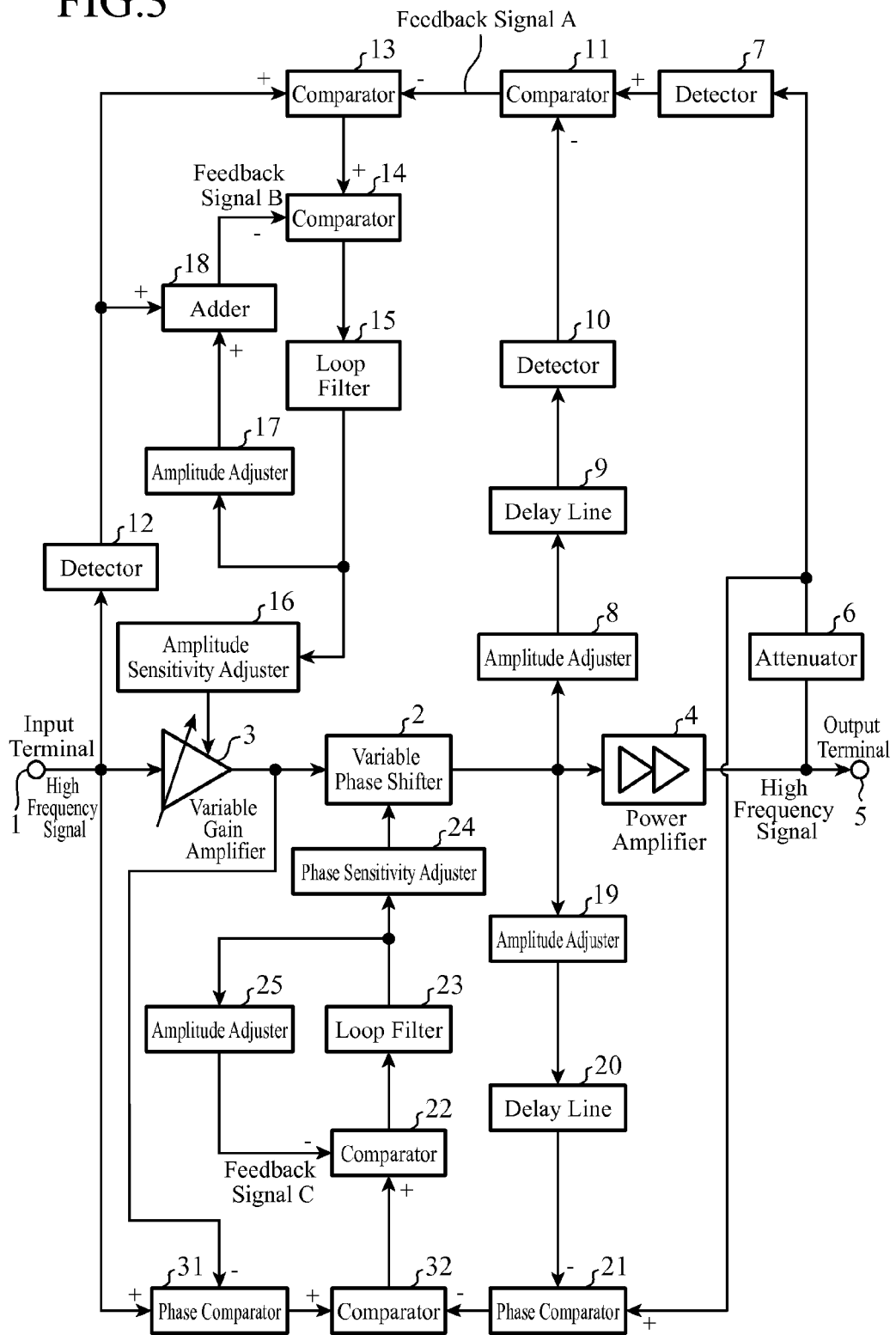
FIG. 3 is a block diagram showing a configuration of an analog feedback amplifier of an embodiment 2 in accordance with the present invention.

FIG. 3 is a block diagram showing a configuration of an analog feedback amplifier of an embodiment 2 in accordance with the present invention. In FIG. 3, since the same reference numerals as those of FIG. 1 and FIG. 2 designate the same or like components, their description will be omitted.

A phase comparator 31 is a signal processor that detects the phase difference between the high frequency signal input via the input terminal 1 and the high frequency signal after the amplification by the variable gain amplifier 3, and supplies the signal with the amplitude corresponding to the phase difference to a comparator 32. Incidentally, the phase comparator 31 constitutes a second phase difference detecting unit. In the present embodiment 2, the phase comparator 21 constitutes the first phase difference detecting unit.

The comparator 32 is a signal processor that detects the difference between the signal output from the phase comparator 21 and the signal output from the phase comparator 31. Incidentally, the comparator 32 constitutes the third signal difference detecting unit.

Next, the operation will be described.

The high frequency signal input via the input terminal 1 is supplied to the variable gain amplifier 3, and to the detector 12 and phase comparator 31.

The variable gain amplifier 3 has its gain controlled by the amplitude sensitivity adjuster 16 which will be described later, and amplifies the high frequency signal input via the input terminal 1.

The variable phase shifter 2 undergoes the phase shift control by the phase sensitivity adjuster 24 which will be described later, adjusts the phase of the high frequency signal after the amplification by the variable gain amplifier 3 by the amount of the phase shift, and supplies the high frequency signal after the phase adjustment to the power amplifier 4.

The power amplifier 4 amplifies the high frequency signal after the phase adjustment by the variable phase shifter 2, and supplies the high frequency signal after the amplification to the output terminal 5 and attenuator 6.

Next, the gain control of the variable gain amplifier 3 will be described.

As for the analog feedback amplifier of FIG. 3, the variable phase shifter 2, power amplifier 4, attenuator 6, detector 7, comparators 11, 13 and 14, loop filter 15 and amplitude sensitivity adjuster 16 form the first feedback loop, and the first feedback loop carries out the band setting and follow-up control of the variable gain amplifier 3.

In addition, the amplitude adjuster 8, delay line 9 and detector 10 form the second feedback loop inside the first feedback loop.

Furthermore, the amplitude adjuster 17 and adder 18 form the third feedback loop inside the second feedback loop.

The attenuator 6, receiving the high frequency signal after the amplification by the power amplifier 4, adjusts the amplitude of the high frequency signal by attenuating the high frequency signal, and supplies the high frequency signal after the amplitude adjustment to the detector 7.

The detector 7, receiving the high frequency signal after the amplitude adjustment from the attenuator 6, detects the high frequency signal.

On the other hand, the amplitude adjuster 8, receiving the high frequency signal after the phase adjustment by the variable phase shifter 2, adjusts the amplitude of the high frequency signal, and supplies the high frequency signal after the amplitude adjustment to the delay line 9.

The delay line 9, receiving the high frequency signal after the amplitude adjustment from the amplitude adjuster 8, delays the high frequency signal.

The detector 10 detects the high frequency signal delayed through the delay line 9.

The comparator 11 detects the difference between the high frequency signal detected by the detector 7 (the high frequency signal attenuated by the attenuator 6) and the high frequency signal detected by the detector 10 (the high frequency signal delayed through the delay line 9), and supplies the difference to the comparator 13 as the feedback signal A.

Here, the amplitude adjuster 8, delay line 9 and detector 10 form the second feedback loop as described above, in which the amount of the amplitude adjustment by the amplitude adjuster 8 is set considering the amplification level of the power amplifier 4 and the attenuation level of the high frequency signal through the attenuator 6, which are known. In addition, the amount of delay of the signal through the delay line 9 is set considering the signal processing time of the power amplifier 4, attenuator 6 and detectors 7 and 10.

More specifically, the amplitude adjustment by the amplitude adjuster 8 and the signal delay through the delay line 9 are set in such a manner as to zero the feedback signal A output from the comparator 11 considering the amplification level and attenuation level and the signal processing time, which are known.

Zeroing the feedback signal A output from the comparator 11 enables canceling the group delay elements of the power amplifier 4 existing on the first feedback loop, and the group delay elements of the power amplifier 4 appear outside the first feedback loop.

This means that the group delay elements of the power amplifier 4 can be handled equivalently to that they exist outside the first feedback loop.

Accordingly, even when the power amplifier 4 includes the group delay elements, the undesired fluctuations of the phase of the feedback signal fed to the variable gain amplifier 3 can be suppressed.

The detector 12 detects the high frequency signal input via the input terminal 1.

The comparator 13 detects the difference between the high frequency signal detected by the detector 12 and the feedback signal A output from the comparator 11.

When the comparator 13 detects the difference between the high frequency signal detected by the detector 12 and the feedback signal A, the comparator 14 detects the difference between the difference and the feedback signal B output from the adder 18.

The loop filter 15 stops the high frequency band of the output signal of the comparator 14 (signal designating the difference between the difference detected by the comparator 13 and the feedback signal B), and supplies only the prescribed low frequency band to the amplitude sensitivity adjuster 16 and amplitude adjuster 17.

Receiving the signal passing through the loop filter 15, the amplitude sensitivity adjuster 16 controls the gain of the variable gain amplifier 3 by adjusting the amplitude sensitivity of the variable gain amplifier 3 in accordance with the rate of change of the passing signal.

For example, it controls the amplitude sensitivity of the variable gain amplifier 3 in such a manner that if the signal passing through the loop filter 15 is multiplied by $\alpha$, the gain of the variable gain amplifier 3 is multiplied by $\beta$ ($\beta=\alpha*\gamma$, where $\gamma$ is a constant).

The amplitude adjuster 17, receiving the signal passing through the loop filter 15, adjusts the amplitude of the passing signal, and supplies the passing signal after the amplitude adjustment to the adder 18.

The adder 18 adds the high frequency signal detected by the detector 12 and the signal which passes through the loop filter 15 and has its amplitude adjusted by amplitude adjuster 17, and supplies the addition result to the comparator 14 as the feedback signal B.

Here, the amplitude adjuster 17 and adder 18 form the third feedback loop inside the second feedback loop as described above, and the third feedback loop feeds back the signal without the group delay elements instead of the signal that is originally fed back through the first feedback loop.

The phase control of the variable phase shifter 2 will now be described.

In the analog feedback amplifier of FIG. 3, the power amplifier 4, attenuator 6, phase comparator 21, comparators 32 and 22, loop filter 23 and phase sensitivity adjuster 24 form the fourth feedback loop, and the fourth feedback loop carries out the band setting and the follow-up control of the variable phase shifter 2.

In addition, the amplitude adjuster 19 and delay line 20 form the fifth feedback loop inside the fourth feedback loop.

Furthermore, the amplitude adjuster 25 forms the sixth feedback loop inside the fifth feedback loop.

Receiving the high frequency signal after the phase adjustment by the variable phase shifter 2, the amplitude adjuster 19 adjusts the amplitude of the high frequency signal, and supplies the high frequency signal after the amplitude adjustment to the delay line 20.

Receiving the high frequency signal after the amplitude adjustment from the amplitude adjuster 19, the delay line 20 delays the high frequency signal.

The phase comparator 21 detects the phase difference between the high frequency signal attenuated by the attenuator 6 and the high frequency signal delayed through the delay line 20, and supplies the signal with the amplitude corresponding to the phase difference to the comparator 32. As the signal with the amplitude corresponding to the phase difference, for example, a signal with amplitude proportional to the phase difference is conceivable.

Here, the amplitude adjuster 19 and delay line 20 constitute the fifth feedback loop as described above, and the amount of the amplitude adjustment by the amplitude adjuster 19 is set considering the amplification level of the power amplifier 4 and the like which are known. In addition, the amount of delay of the signal passing through the delay line 20 is set considering the signal processing time of the power amplifier 4 and the like.

More specifically, the amplitude adjustment by the amplitude adjuster 19 and the signal delay through the delay line 20 are set in such a manner as to zero the phase difference detected by the phase comparator 21 considering the amplification level and the signal processing time which are known.

Zeroing the phase difference detected by the phase comparator 21 enables canceling the group delay elements of the power amplifier 4 existing on the fourth feedback loop, and the group delay elements of the power amplifier 4 appear outside the fourth feedback loop.

This means that the group delay elements of the power amplifier 4 can be handled equivalently to that they exist outside the fourth feedback loop.

Accordingly, even when the power amplifier 4 includes the group delay elements, the undesired fluctuations of the phase of the feedback signal fed to the variable phase shifter 2 can be suppressed.

The phase comparator 31 detects the phase difference between the high frequency signal input via the input terminal 1 and the high frequency signal after the amplification by the variable gain amplifier 3, and supplies a signal with the amplitude corresponding to the phase difference to the comparator 32. As the signal with the amplitude corresponding to the phase difference, for example, the signal with amplitude proportional to the phase difference is conceivable.

The comparator 32 detects the difference between the signal output from the phase comparator 21 and the signal output from the phase comparator 31.

The comparator 22 detects the difference between the output signal of the comparator 32 and the feedback signal C output from the amplitude adjuster 25.

The loop filter 23 stops the high frequency band of the output signal of the comparator 22 (signal designating the difference between the output signal of the comparator 32 and the feedback signal C) so as to supply only the prescribed low frequency band to the phase sensitivity adjuster 24 and amplitude adjuster 25.

Receiving the signal passing through the loop filter 23, the phase sensitivity adjuster 24 adjusts the phase shift sensitivity of the variable phase shifter 2 in accordance with the rate of change of the passing signal, thereby controlling the phase shift by the variable phase shifter 2.

For example, it adjusts the phase shift sensitivity of the variable phase shifter 2 in such a manner that when the passing signal through the loop filter 24 is multiplied by a, the phase shift of the variable phase shifter 2 is multiplied by b (b=a*c, where c is a constant).

Receiving the signal passing through the loop filter 23, the amplitude adjuster 25 adjusts the amplitude of the passing signal, and supplies the passing signal after the amplitude adjustment to the comparator 22.

Here, the amplitude adjuster 25 forms the sixth feedback loop inside the fifth feedback loop as described above, and the sixth feedback loop feeds back the signal without the group delay elements instead of the signal that is originally fed back through the fourth feedback loop.

As is clear from the foregoing description, according to the present embodiment 2, it is configured in such a manner that it comprises the attenuator 6 that attenuates the high frequency signal after the amplification by the power amplifier 4; the amplitude adjuster 8 that adjusts the amplitude of the high frequency signal after the phase adjustment by the variable phase shifter 2; the delay line 9 that delays the high frequency signal after the amplitude adjustment by the amplitude adjuster 8; the comparator 11 that detects the difference between the high frequency signal attenuated by the attenuator 6 and the high frequency signal delayed through the delay line 9, and outputs the difference as the feedback signal A; the comparator 13 that detects the difference between the high frequency signal detected by the detector 12 and the feedback signal A output from the comparator 11; the comparator 14 that detects the difference between the difference detected by the comparator 13 and the feedback signal B output from the adder 18; and the loop filter 15 that passes only the prescribed low frequency band in the output signal of the comparator 14, wherein the amplitude sensitivity adjuster 16 adjusts the amplitude sensitivity of the variable gain amplifier 3 in accordance with the rate of change of the signal passing through the loop filter 15, thereby controlling the gain of the variable gain amplifier 3. Accordingly, even when the power amplifier 4 includes the group delay elements, the present embodiment 2 can suppress the undesired fluctuations of the phase of the feedback signal fed to the variable gain amplifier 3, thereby offering an advantage of being able to broaden the band.

In addition, according to the present embodiment 2, it is configured in such a manner that it comprises the attenuator 6 that attenuates the high frequency signal after the amplification by the power amplifier 4; the amplitude adjuster 19 that adjusts the amplitude of the high frequency signal after the amplification by the variable gain amplifier 3; the delay line 20 that delays the high frequency signal after the amplitude adjustment by the amplitude adjuster 19; the phase comparator 21 that detects the phase difference between the high frequency signal attenuated by the attenuator 6 and the high frequency signal delayed through the delay line 20, and outputs the signal with the amplitude corresponding to the phase difference; the phase comparator 31 that detects the phase difference between the high frequency signal input via the input terminal 1 and the high frequency signal after the amplification by the variable gain amplifier 3, and outputs the signal with the amplitude corresponding to the phase difference; the comparator 32 that detects the difference between the signal output from the phase comparator 21 and the signal output from the phase comparator 31; the comparator 22 that detects the difference between the output signal of the comparator 32 and the feedback signal C output from the amplitude adjuster 25; and the loop filter 23 that passes only the prescribed low frequency band of the output signal of the comparator 22, wherein the phase sensitivity adjuster 24 adjusts the phase shift sensitivity of the variable phase shifter 2 in accordance with the rate of change of the signal passing through the loop filter 23, thereby controlling the phase shift by the variable phase shifter 2. Accordingly, even when the power amplifier 4 includes the group delay elements, the present embodiment 2 can suppress the undesired fluctuations of the phase of the feedback signal fed to the variable phase shifter 2, thereby offering an advantage of being able to broaden the band.

Although the present embodiment 2 shows an example in which the phase comparators 21 and 31 detect the phase differences and output the signals with the amplitude corresponding to the phase differences, any other components can be used instead of the phase comparators as long as they can output a signal with the amplitude corresponding to the phase difference.

In addition, although the present embodiment 2 shows an example in which the amplitude adjusters 8, 17, 19, and 25 adjust the amplitude of the signals, when the amount of the adjustment of the amplitude is unity (that is, when the amplitude of the input signal is equal to that of the output signal), the amplitude adjusters 8, 17, 19, and 25 can be removed.

In addition, although the present embodiment 2 shows an example in which the attenuator 6 attenuates the high frequency signal after the amplification by the power amplifier 4, when the amount of the attenuation of the amplitude is unity (that is, when the amplitude of the input signal is equal to that of the output signal), the attenuator 6 can be omitted.

Although the present embodiment 2 shows an example in which the delay lines 9 and 20 delay the high frequency signals after the amplitude adjustment by the amplitude adjusters 8 and 19, any other components capable of delaying the high frequency signal after the amplitude adjustment can also be used such as a lumped circuit comprised of an inductor and capacitor, and a delay circuit comprised of a semiconductor.

In addition, although the present embodiment 2 has the amplitude adjuster 8, the delay line 9, and the detector 10 connected in series in this order, the order can be changed as long as they are connected in series.

In addition, although the present embodiment 2 has the amplitude adjuster 19 and the delay line 20 connected in series in this order, the order can be changed as long as they are connected in series.

Embodiment 3

Figure 4:
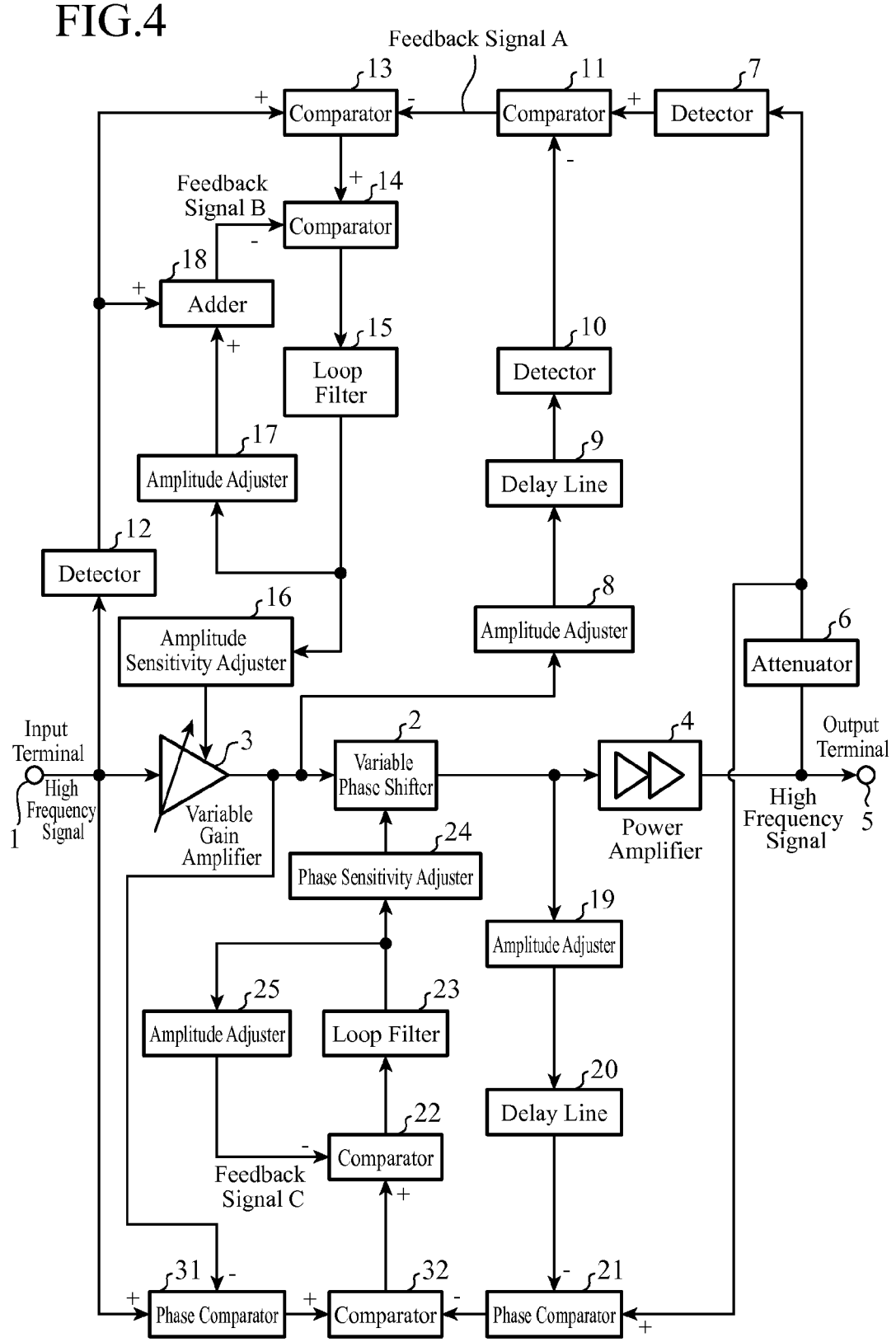
FIG. 4 is a block diagram showing a configuration of an analog feedback amplifier of an embodiment 3 in accordance with the present invention.

FIG. 4 is a block diagram showing a configuration of an analog feedback amplifier of an embodiment 3 in accordance with the present invention. In FIG. 4, since the same reference numerals as those of FIG. 3 designate the same or like components, their description will be omitted.

Although the embodiment 2 shows an example in which the amplitude adjuster 8 adjusts the amplitude of the high frequency signal after the phase adjustment by the variable phase shifter 2, the amplitude adjuster 8 can adjust the amplitude of the high frequency signal after the amplification by the variable gain amplifier 3 as shown in FIG. 4.

Next, the operation will be described.

The high frequency signal input via the input terminal 1 is supplied to the variable gain amplifier 3, and to the detector 12 and phase comparator 31.

The variable gain amplifier 3 has its gain controlled by the amplitude sensitivity adjuster 16 which will be described later, and amplifies the high frequency signal input via the input terminal 1.

The variable phase shifter 2 undergoes the phase shift control by the phase sensitivity adjuster 24 which will be described later, adjusts the phase of the high frequency signal after the amplification by the variable gain amplifier 3 by the amount of the phase shift, and supplies the high frequency signal after the phase adjustment to the power amplifier 4.

The power amplifier 4 amplifies the high frequency signal after the phase adjustment by the variable phase shifter 2, and supplies the high frequency signal after the amplification to the output terminal 5 and attenuator 6.

Next, the gain control of the variable gain amplifier 3 will be described.

As for the analog feedback amplifier of FIG. 4, the variable phase shifter 2, power amplifier 4, attenuator 6, detector 7, comparators 11, 13 and 14, loop filter 15 and amplitude sensitivity adjuster 16 form the first feedback loop, and the first feedback loop carries out the band setting and follow-up control of the variable gain amplifier 3.

In addition, the amplitude adjuster 8, delay line 9 and detector 10 form the second feedback loop inside the first feedback loop.

Furthermore, the amplitude adjuster 17 and adder 18 form the third feedback loop inside the second feedback loop.

The attenuator 6, receiving the high frequency signal after the amplification by the power amplifier 4, adjusts the amplitude of the high frequency signal by attenuating the high frequency signal, and supplies the high frequency signal after the amplitude adjustment to the detector 7.

The detector 7, receiving the high frequency signal after the amplitude adjustment from the attenuator 6, detects the high frequency signal.

On the other hand, the amplitude adjuster 8, receiving the high frequency signal after the amplification by the variable gain amplifier 3, adjusts the amplitude of the high frequency signal, and supplies the high frequency signal after the amplitude adjustment to the delay line 9.

The delay line 9, receiving the high frequency signal after the amplitude adjustment from the amplitude adjuster 8, delays the high frequency signal.

The detector 10 detects the high frequency signal delayed through the delay line 9.

The comparator 11 detects the difference between the high frequency signal detected by the detector 7 (the high frequency signal attenuated by the attenuator 6) and the high frequency signal detected by the detector 10 (the high frequency signal delayed through the delay line 9), and supplies the difference to the comparator 13 as the feedback signal A.

Here, the amplitude adjuster 8, delay line 9 and detector 10 form the second feedback loop as described above, in which the amount of the amplitude adjustment by the amplitude adjuster 8 is set considering slight amplitude modifications in the variable phase shifter 2, the amplification level of the power amplifier 4 and the attenuation level of the high frequency signal through the attenuator 6, which are known. In addition, the amount of delay of the signal through the delay line 9 is set considering the signal processing time of the variable phase shifter 2, power amplifier 4, attenuator 6 and detectors 7 and 10.

More specifically, the amplitude adjustment by the amplitude adjuster 8 and the signal delay through the delay line 9 are set in such a manner as to zero the feedback signal A output from the comparator 11 considering the amplification level and attenuation level and the signal processing time, which are known.

Zeroing the feedback signal A output from the comparator 11 enables canceling the group delay elements of the power amplifier 4 existing on the first feedback loop, and the group delay elements of the power amplifier 4 appear outside the first feedback loop.

This means that the group delay elements of the power amplifier 4 can be handled equivalently to that they exist outside the first feedback loop.

Accordingly, even when the power amplifier 4 includes the group delay elements, the undesired fluctuations of the phase of the feedback signal fed to the variable gain amplifier 3 can be suppressed.

The detector 12 detects the high frequency signal input via the input terminal 1.

The comparator 13 detects the difference between the high frequency signal detected by the detector 12 and the feedback signal A output from the comparator 11.

When the comparator 13 detects the difference between the high frequency signal detected by the detector 12 and the feedback signal A, the comparator 14 detects the difference between the difference and the feedback signal B output from the adder 18.

The loop filter 15 stops the high frequency band of the output signal of the comparator 14 (signal designating the difference between the difference detected by the comparator 13 and the feedback signal B), and supplies only the prescribed low frequency band to the amplitude sensitivity adjuster 16 and amplitude adjuster 17.

Receiving the signal passing through the loop filter 15, the amplitude sensitivity adjuster 16 controls the gain of the variable gain amplifier 3 by adjusting the amplitude sensitivity of the variable gain amplifier 3 in accordance with the rate of change of the passing signal.

For example, it controls the amplitude sensitivity of the variable gain amplifier 3 in such a manner that if the signal passing through the loop filter 15 is multiplied by $\alpha$, the gain of the variable gain amplifier 3 is multiplied by $\beta$ ($\beta=\alpha*\gamma$, where $\gamma$ is a constant).

The amplitude adjuster 17, receiving the signal passing through the loop filter 15, adjusts the amplitude of the passing signal, and supplies the passing signal after the amplitude adjustment to the adder 18.

The adder 18 adds the high frequency signal detected by the detector 12 and the signal which passes through the loop filter 15 and has its amplitude adjusted by amplitude adjuster 17, and supplies the addition result to the comparator 14 as the feedback signal B.

Here, the amplitude adjuster 17 and adder 18 form the third feedback loop inside the second feedback loop as described above, and the third feedback loop feeds back the signal without the group delay elements instead of the signal that is originally fed back through the first feedback loop.

The phase control of the variable phase shifter 2 will now be described.

In the analog feedback amplifier of FIG. 4, the power amplifier 4, attenuator 6, phase comparator 21, comparators 32 and 22, loop filter 23 and phase sensitivity adjuster 24 form the fourth feedback loop, and the fourth feedback loop carries out the band setting and the follow-up control of the variable phase shifter 2.

In addition, the amplitude adjuster 19 and delay line 20 form the fifth feedback loop inside the fourth feedback loop.

Furthermore, the amplitude adjuster 25 forms the sixth feedback loop inside the fifth feedback loop.

Receiving the high frequency signal after the phase adjustment by the variable phase shifter 2, the amplitude adjuster 19 adjusts the amplitude of the high frequency signal, and supplies the high frequency signal after the amplitude adjustment to the delay line 20.

Receiving the high frequency signal after the amplitude adjustment from the amplitude adjuster 19, the delay line 20 delays the high frequency signal.

The phase comparator 21 detects the phase difference between the high frequency signal attenuated by the attenuator 6 and the high frequency signal delayed through the delay line 20, and supplies the signal with the amplitude corresponding to the phase difference to the comparator 32. As the signal with the amplitude corresponding to the phase difference, for example, a signal with amplitude proportional to the phase difference is conceivable.

Here, the amplitude adjuster 19 and delay line 20 constitute the fifth feedback loop as described above, and the amount of the amplitude adjustment by the amplitude adjuster 19 is set considering the amplification level of the power amplifier 4 and the like which are known. In addition, the amount of delay of the signal passing through the delay line 20 is set considering the signal processing time of the power amplifier 4 and the like.

More specifically, the amplitude adjustment by the amplitude adjuster 19 and the signal delay through the delay line 20 are set in such a manner as to zero the phase difference detected by the phase comparator 21 considering the amplification level and the signal processing time which are known.

Zeroing the phase difference detected by the phase comparator 21 enables canceling the group delay elements of the power amplifier 4 existing on the fourth feedback loop, and the group delay elements of the power amplifier 4 appear outside the fourth feedback loop.

This means that the group delay elements of the power amplifier 4 can be handled equivalently to that they exist outside the fourth feedback loop.

Accordingly, even when the power amplifier 4 includes the group delay elements, the undesired fluctuations of the phase of the feedback signal fed to the variable phase shifter 2 can be suppressed.

The phase comparator 31 detects the phase difference between the high frequency signal input via the input terminal 1 and the high frequency signal after the amplification by the variable gain amplifier 3, and supplies a signal with the amplitude corresponding to the phase difference to the comparator 32. As the signal with the amplitude corresponding to the phase difference, for example, the signal with amplitude proportional to the phase difference is conceivable.

The comparator 32 detects the difference between the signal output from the phase comparator 21 and the signal output from the phase comparator 31.

The comparator 22 detects the difference between the output signal of the comparator 32 and the feedback signal C output from the amplitude adjuster 25.

The loop filter 23 stops the high frequency band of the output signal of the comparator 22 (signal designating the difference between the output signal of the comparator 32 and the feedback signal C) so as to supply only the prescribed low frequency band to the phase sensitivity adjuster 24 and amplitude adjuster 25.

Receiving the signal passing through the loop filter 23, the phase sensitivity adjuster 24 adjusts the phase shift sensitivity of the variable phase shifter 2 in accordance with the rate of change of the passing signal, thereby controlling the phase shift by the variable phase shifter 2.

For example, it adjusts the phase shift sensitivity of the variable phase shifter 2 in such a manner that when the passing signal through the loop filter 24 is multiplied by a, the phase shift of the variable phase shifter 2 is multiplied by b (b=a*c, where c is a constant).

Receiving the signal passing through the loop filter 23, the amplitude adjuster 25 adjusts the amplitude of the passing signal, and supplies the passing signal after the amplitude adjustment to the comparator 22.

Here, the amplitude adjuster 25 forms the sixth feedback loop inside the fifth feedback loop as described above, and the sixth feedback loop feeds back the signal without the group delay elements instead of the signal that is originally fed back through the fourth feedback loop.

As is clear from the foregoing description, according to the present embodiment 3, it is configured in such a manner that it comprises the attenuator 6 that attenuates the high frequency signal after the amplification by the power amplifier 4; the amplitude adjuster 8 that adjusts the amplitude of the high frequency signal after the amplification by the variable gain amplifier 3; the delay line 9 that delays the high frequency signal after the amplitude adjustment by the amplitude adjuster 8; the comparator 11 that detects the difference between the high frequency signal attenuated by the attenuator 6 and the high frequency signal delayed through the delay line 9, and outputs the difference as the feedback signal A; the comparator 13 that detects the difference between the high frequency signal detected by the detector 12 and the feedback signal A output from the comparator 11; the comparator 14 that detects the difference between the difference detected by the comparator 13 and the feedback signal B output from the adder 18; and the loop filter 15 that passes only the prescribed low frequency band in the output signal of the comparator 14, wherein the amplitude sensitivity adjuster 16 adjusts the amplitude sensitivity of the variable gain amplifier 3 in accordance with the rate of change of the signal passing through the loop filter 15, thereby controlling the gain of the variable gain amplifier 3. Accordingly, even when the power amplifier 4 includes the group delay elements, the present embodiment 3 can suppress the undesired fluctuations of the phase of the feedback signal fed to the variable gain amplifier 3, thereby offering an advantage of being able to broaden the band.

In addition, according to the present embodiment 3, it is configured in such a manner that it comprises the attenuator 6 that attenuates the high frequency signal after the amplification by the power amplifier 4; the amplitude adjuster 19 that adjusts the amplitude of the high frequency signal after the amplification by the variable gain amplifier 3; the delay line 20 that delays the high frequency signal after the amplitude adjustment by the amplitude adjuster 19; the phase comparator 21 that detects the phase difference between the high frequency signal attenuated by the attenuator 6 and the high frequency signal delayed through the delay line 20, and outputs the signal with the amplitude corresponding to the phase difference; the phase comparator 31 that detects the phase difference between the high frequency signal input via the input terminal 1 and the high frequency signal after the amplification by the variable gain amplifier 3, and outputs the signal with the amplitude corresponding to the phase difference; the comparator 32 that detects the difference between the signal output from the phase comparator 21 and the signal output from the phase comparator 31; the comparator 22 that detects the difference between the output signal of the comparator 32 and the feedback signal C output from the amplitude adjuster 25; and the loop filter 23 that passes only the prescribed low frequency band of the output signal of the comparator 22, wherein the phase sensitivity adjuster 24 adjusts the phase shift sensitivity of the variable phase shifter 2 in accordance with the rate of change of the signal passing through the loop filter 23, thereby controlling the phase shift by the variable phase shifter 2. Accordingly, even when the power amplifier 4 includes the group delay elements, the present embodiment 3 can suppress the undesired fluctuations of the phase of the feedback signal fed to the variable phase shifter 2, thereby offering an advantage of being able to broaden the band.

Although the present embodiment 3 shows an example in which the phase comparators 21 and 31 detect the phase differences and output the signals with the amplitude corresponding to the phase differences, any other components can be used instead of the phase comparators as long as they can output a signal with the amplitude corresponding to the phase difference.

In addition, although the present embodiment 3 shows an example in which the amplitude adjusters 8, 17, 19, and 25 adjust the amplitude of the signals, when the amount of the adjustment of the amplitude is unity (that is, when the amplitude of the input signal is equal to that of the output signal), the amplitude adjusters 8, 17, 19, and 25 can be removed.

In addition, although the present embodiment 3 shows an example in which the attenuator 6 attenuates the high frequency signal after the amplification by the power amplifier 4, when the amount of the attenuation of the amplitude is unity (that is, when the amplitude of the input signal is equal to that of the output signal), the attenuator 6 can be omitted.

Although the present embodiment 3 shows an example in which the delay lines 9 and 20 delay the high frequency signals after the amplitude adjustment by the amplitude adjusters 8 and 19, any other components capable of delaying the high frequency signal after the amplitude adjustment can also be used such as a lumped circuit comprised of an inductor and capacitor, and a delay circuit comprised of a semiconductor.

In addition, although the present embodiment 3 has the amplitude adjuster 8, the delay line 9, and the detector 10 connected in series in this order, the order can be changed as long as they are connected in series.

In addition, although the present embodiment 3 has the amplitude adjuster 19 and the delay line 20 connected in series in this order, the order can be changed as long as they are connected in series.

Incidentally, it is to be understood that a free combination of the individual embodiments, variations of any components of the individual embodiments or removal of any components of the individual embodiments is possible within the scope of the present invention.

INDUSTRIAL APPLICABILITY

As described above, an analog feedback amplifier in accordance with the present invention is suitable for applications as an amplifier that must broaden the band by suppressing the undesired phase fluctuations of the feedback signal.

DESCRIPTION OF REFERENCE SYMBOLS

1 input terminal; 2 variable phase shifter; 3 variable gain amplifier; 4 power amplifier; 5 output terminal; 6 attenuator (first amplitude adjusting unit); 7 detector (first signal difference detecting unit); 8 amplitude adjuster (second amplitude adjusting unit); 9 delay line (first delay unit); 10 detector (first signal difference detecting unit); 11 comparator (first signal difference detecting unit); 12 detector (second signal difference detecting unit); 13 comparator (second signal difference detecting unit); 14 comparator (gain control unit); 15 loop filter (gain control unit); 16 amplitude sensitivity adjuster (gain control unit); 17 amplitude adjuster (third amplitude adjusting unit); 18 adder (third amplitude adjusting unit); 19 amplitude adjuster (fourth amplitude adjusting unit); 20 delay line (second delay unit); 21 phase comparator (phase difference detecting unit, first phase difference detecting unit); 22 comparator (phase shift control unit); 23 loop filter (phase shift control unit); 24 phase sensitivity adjuster (phase shift control unit); 25 amplitude adjuster (fifth amplitude adjusting unit); 31 phase comparator (second phase difference detecting unit); 32 comparator (third signal difference detecting unit).

What is claimed is:

1. An analog feedback amplifier including:
   a variable phase shifter that adjusts a phase of an input signal;
   a variable gain amplifier that amplifies the input signal; and
   a power amplifier that amplifies the input signal, wherein
   the variable phase shifter, the variable gain amplifier and the power amplifier are connected in series in this order, or the variable gain amplifier, the variable phase shifter and the power amplifier are connected in series in this order, the analog feedback amplifier comprising:
   a first amplitude adjusting circuit that adjusts amplitude of the signal after the amplification by the power amplifier;
   a second amplitude adjusting circuit that adjusts amplitude of the signal after the amplification by the variable gain amplifier;
   a first delay circuit that delays the signal after the amplitude adjustment by the second amplitude adjusting circuit;
   a first signal difference detecting circuit that detects difference between the signal after the amplitude adjustment by the first amplitude adjusting circuit and the signal delayed through the first delay circuit, and outputs the difference as a first feedback signal;
   a second signal difference detecting circuit that detects the difference between the input signal and the first feedback signal output from the first signal difference detecting circuit;
   a gain control circuit that detects difference between the difference detected by the second signal difference detecting circuit and a second feedback signal, and controls gain of the variable gain amplifier in accordance with the difference; and
   a third amplitude adjusting circuit that adjusts amplitude of the difference detected by the gain control circuit, adds the difference after the amplitude adjustment to the input signal, and supplies the addition result to the gain control circuit as the second feedback signal.

2. The analog feedback amplifier according to claim 1, further comprising:
   a fourth amplitude adjusting circuit that adjusts the amplitude of the signal after the amplification by the variable gain amplifier;
   a second delay circuit that delays the signal after the amplitude adjustment by the fourth amplitude adjusting circuit;
   a phase difference detecting circuit that detects phase difference between the signal after the amplitude adjustment by the first amplitude adjusting circuit and the signal delayed through the second delay circuit, and outputs a signal with amplitude corresponding to the phase difference;
   a phase shift control circuit that detects difference between the signal output from the phase difference detecting circuit and a third feedback signal, and controls the phase shift by the variable phase shifter in accordance with the difference; and
   a fifth amplitude adjusting circuit that adjusts amplitude of the difference detected by the phase shift control circuit, and supplies the difference after the amplitude adjustment to the phase shift control circuit as the third feedback signal.

3. The analog feedback amplifier according to claim 2, wherein
   the amplitude adjustment by the second amplitude adjusting circuit and the signal delay by the first delay circuit are set in a manner as to zero the first feedback signal output from the first signal difference detecting circuit; and the amplitude adjustment by the fourth amplitude adjusting circuit and the signal delay by the second delay circuit are set in a manner as to zero the phase difference detected by the phase difference detecting circuit.

4. An analog feedback amplifier comprising:
a variable gain amplifier that amplifies an input signal;
a variable phase shifter that adjusts a phase of the signal after the amplification by the variable gain amplifier;
a power amplifier that amplifies the signal after the phase adjustment by the variable phase shifter;
a first amplitude adjusting circuit that adjusts amplitude of the signal after the amplification by the power amplifier;
a second amplitude adjusting circuit that adjusts the amplitude of the signal after the phase adjustment by the variable phase shifter;
a first delay circuit that delays the signal after the amplitude adjustment by the second amplitude adjusting circuit;
a first signal difference detecting circuit that detects difference between the signal after the amplitude adjustment by the first amplitude adjusting circuit and the signal delayed through the first delay circuit, and outputs the difference as the first feedback signal;
a second signal difference detecting circuit that detects difference between the input signal and the first feedback signal output from the first signal difference detecting circuit;
a gain control circuit that detects difference between the difference detected by the second signal difference detecting circuit and a second feedback signal, and controls the gain of the variable gain amplifier in accordance with the difference; and
a third amplitude adjusting circuit that adjusts amplitude of the difference detected by the gain control circuit, adds the difference after the amplitude adjustment to the input signal, and supplies the addition result to the gain control circuit as the second feedback signal.

5. The analog feedback amplifier according to claim 4, further comprising:
a fourth amplitude adjusting circuit that adjusts the amplitude of the signal after the phase adjustment by the variable phase shifter;
a second delay circuit that delays the signal after the amplitude adjustment by the fourth amplitude adjusting circuit;
a first phase difference detecting circuit that detects phase difference between the signal after the amplitude adjustment by the first amplitude adjusting circuit and the signal delayed through the second delay circuit, and outputs a signal with amplitude corresponding to the phase difference;
a second phase difference detecting circuit that detects phase difference between the input signal and the signal after the amplification by the variable gain amplifier, and outputs a signal with amplitude corresponding to the phase difference;
a third signal difference detecting circuit that detects difference between the signal output from the first phase difference detecting circuit and the signal output from the second phase difference detecting circuit;
a phase shift control circuit that detects difference between the difference detected by the third signal difference detecting circuit and a third feedback signal, and controls the phase shift by the variable phase shifter in accordance with the difference; and a fifth amplitude adjusting circuit that adjusts amplitude of the difference detected by the phase shift control circuit, and supplies the difference after the amplitude adjustment to the phase shift control circuit as the third feedback signal.

6. The analog feedback amplifier according to claim 5, wherein
the amplitude adjustment by the second amplitude adjusting circuit and the signal delay by the first delay circuit are set in a manner as to zero the first feedback signal output from the first signal difference detecting circuit; and the amplitude adjustment by the fourth amplitude adjusting circuit and the signal delay by the second delay circuit are set in a manner as to zero the phase difference detected by the first phase difference detecting circuit.

7. An analog feedback amplifier comprising:
a variable gain amplifier that amplifies an input signal;
a variable phase shifter that adjusts a phase of the signal after the amplification by the variable gain amplifier;
a power amplifier that amplifies the signal after the phase adjustment by the variable phase shifter;
a first amplitude adjusting circuit that adjusts amplitude of the signal after the amplification by the power amplifier;
a second amplitude adjusting circuit that adjusts the amplitude of the signal after the amplification by the variable gain amplifier;
a first delay circuit that delays the signal after the amplitude adjustment by the second amplitude adjusting circuit;
first signal difference detecting circuit that detects difference between the signal after the amplitude adjustment by the first amplitude adjusting circuit and the signal delayed through the first delay circuit, and outputs the difference as the first feedback signal;
a second signal difference detecting circuit that detects difference between the input signal and the first feedback signal output from the first signal difference detecting circuit;
a gain control circuit that detects difference between the difference detected by the second signal difference detecting circuit and a second feedback signal, and controls the gain of the variable gain amplifier in accordance with the difference; and
a third amplitude adjusting circuit that adjusts amplitude of the difference detected by the gain control circuit, adds the difference after the amplitude adjustment to the input signal, and supplies the addition result to the gain control circuit as the second feedback signal.

8. The analog feedback amplifier according to claim 7, further comprising:
a fourth amplitude adjusting circuit that adjusts the amplitude of the signal after the phase adjustment by the variable phase shifter;
a second delay circuit that delays the signal after the amplitude adjustment by the fourth amplitude adjusting circuit;
a first phase difference detecting circuit that detects phase difference between the signal after the amplitude adjustment by the first amplitude adjusting circuit and the signal delayed through the second delay circuit, and outputs a signal with amplitude corresponding to the phase difference;
a second phase difference detecting circuit that detects phase difference between the input signal and the signal after the amplification by the variable gain amplifier, and outputs a signal with amplitude corresponding to the phase difference;

a third signal difference detecting circuit that detects difference between the signal output from the first phase difference detecting circuit and the signal output from the second phase difference detecting circuit;

a phase shift control circuit that detects difference between the difference detected by the third signal difference detecting circuit and a third feedback signal, and controls the phase shift by the variable phase shifter in accordance with the difference; and a fifth amplitude adjusting circuit that adjusts amplitude of the difference detected by the phase shift control circuit, and supplies the difference after the amplitude adjustment to the phase shift control circuit as the third feedback signal.

9. The analog feedback amplifier according to claim 8, wherein the amplitude adjustment by the second amplitude adjusting circuit and the signal delay by the first delay circuit are set in a manner as to zero the first feedback signal output from the first signal difference detecting circuit; and the amplitude adjustment by the fourth amplitude adjusting circuit and the signal delay by the second delay circuit are set in a manner as to zero the phase difference detected by the first phase difference detecting circuit.

* * * * *